United States Patent
Lau et al.

(10) Patent No.: US 11,284,502 B2
(45) Date of Patent: Mar. 22, 2022

(54) THERMAL RELIEF FOR THROUGH-HOLE AND SURFACE MOUNTING

(71) Applicant: Western Digital Technologies, Inc., San Jose, CA (US)

(72) Inventors: Chun Sean Lau, Bayan Lepas (MY); Choon Kuai Lee, Bayan Lepas (MY); Ing Chyuan Ooi, Simpang Ampat (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/787,482

(22) Filed: Feb. 11, 2020

(65) Prior Publication Data
US 2021/0251068 A1    Aug. 12, 2021

(51) Int. Cl.
*H05K 1/02*      (2006.01)
*H05K 1/11*      (2006.01)

(52) U.S. Cl.
CPC .......... *H05K 1/0206* (2013.01); *H05K 1/113* (2013.01); *H05K 2201/062* (2013.01)

(58) Field of Classification Search
CPC ............... H05K 1/0206; H05K 1/0209; H05K 2201/0939; H05K 2201/09418
See application file for complete search history.

(56) References Cited

U.S. PATENT DOCUMENTS

| | | | |
|---|---|---|---|
| 5,371,653 A * | 12/1994 | Kametani | H01L 23/467 174/252 |
| 5,451,720 A | 9/1995 | Estes et al. | |
| 6,235,994 B1 * | 5/2001 | Chamberlin | H05K 1/0201 174/252 |
| 6,646,886 B1 * | 11/2003 | Popovich | H05K 1/0265 174/255 |
| 7,462,933 B2 * | 12/2008 | Zhao | H01L 23/24 257/713 |
| 10,390,430 B1 * | 8/2019 | Chou | H05K 1/115 |

(Continued)

FOREIGN PATENT DOCUMENTS

JP      2001308488 A      11/2001
TW      201117682 A      5/2011

OTHER PUBLICATIONS

IPC Association Connecting Electronics Industries, IPC-2221A: Generic Standard on Printed Board Design (May 2003).

*Primary Examiner* — Paresh H Paghadal
(74) *Attorney, Agent, or Firm* — Volpe Koenig

(57) ABSTRACT

A multi-layer printed circuit board (PCB) has a bonding surface disposed on a first surface and a first thermal relief pad disposed on the first surface and surrounding the bonding surface. A first conductive plane on the first surface partially surrounds the first thermal relief pad. The first conductive plane is connected to the bonding surface by one or more first spokes. A second thermal relief pad is disposed on the first surface and partially surrounds the first conductive plane. A second conductive plane is disposed on the first surface and surrounds the second thermal relief pad. The second conductive plane is connected to the first conductive plane by one or more second spokes. A through hole is located in the bonding surface for receiving an electrical connector of an electronic component.

16 Claims, 8 Drawing Sheets

(56) References Cited

U.S. PATENT DOCUMENTS

| | | | | |
|---|---|---|---|---|
| 2007/0029108 A1* | 2/2007 | Nakao | ............... | H05K 3/3447 |
| | | | | 174/260 |
| 2009/0183899 A1* | 7/2009 | Ishida | ............... | H05K 3/3447 |
| | | | | 174/252 |
| 2011/0000707 A1* | 1/2011 | Kawai | ............... | H05K 1/116 |
| | | | | 174/266 |
| 2013/0128532 A1* | 5/2013 | Que | ............... | G02F 1/133608 |
| | | | | 362/97.1 |
| 2016/0330832 A1* | 11/2016 | Kapoor | ............... | H05K 1/0271 |

\* cited by examiner

THERMAL RELIEF FOR THROUGH-HOLE AND SURFACE MOUNTING

FIELD OF INVENTION

This application relates to printed circuit boards, and, more particularly, to thermal relief features for through holes in a printed circuit board.

BACKGROUND

Printed circuit boards (PCBs) are used to create circuit assemblies by electromechanically connecting electronic components mounted on the PCB. PCBs typically include several layers of insulating and conductive material. The conductive layers typically include metal planes and/or traces, which provide signals, power, and ground to the mounted components. The conductive layers may include any suitable conductive material, such as copper. The conductive layers are separated by and "sandwiched" in between the insulating layers, which may include planes of a fiber-reinforced polymer resin, or any other suitable insulating material.

Electronic components are mounted to the PCB in any of several ways, such as through-hole or surface-mount soldering. In through-hole soldering, a lead or pin of the component is inserted into a through-hole of the PCB and electromechanically connected to the PCB by filling the through-hole with solder (e.g., by wave soldering) to form a solder joint. In surface mount soldering, contacts of the component are electromechanically connected to bonding pads of the PCB with solder (e.g., by reflow soldering) to form a solder joint.

In some through-hole soldering applications, it is desired to fill the space between the through-hole and the component lead with solder to a minimum percentage fill depth from the solder supply side of the through-hole (or correspondingly, to a minimum percentage depression depth from the side of the through-hole opposite to the solder supply side). Because the space between the through-hole and the component lead is typically a hollow cylinder, or "barrel shaped", this can be referred to as a "barrel fill" depth. The achievable barrel fill depth can be affected by several variables, including heating temperature, heating time, and the heat dissipation characteristics of the PCB. In some surface-mount device connection processes, the pins of the surface mount devices are connected to the PCB by solder reflowing.

When the leads of a thru-hole part connect directly to an internal power or ground plane, the metal plane can act as a heat sink during soldering. The large area of metal in a plane will cause the heat to dissipate, such that it takes a longer time to make a solder connection, leading to bad solder joints, which could eventually break causing intermittent contact or an open connection in through-hole soldering and tombstoning in surface mount device (SMD) soldering.

SUMMARY

The present application is directed to devices, methods, and systems for managing temperature dependent soldering failures. In some implementations, a bonding surface is disposed on a first surface of a printed circuit board. A first thermal relief pad is disposed on the first surface and partially surrounds the bonding surface. A first conductive plane on the first surface partially surrounds the first thermal relief pad. The first conductive plane is connected to the bonding surface by at least one first spoke. A second thermal relief pad is disposed on the first surface and partially surrounds the first thermal relief pad. A second conductive plane is disposed on the first surface and partially surrounds the second thermal relief pad. The second conductive plane is connected to the first conductive plane by at least one second spoke which extends through the second thermal relief pad.

DETAILED DESCRIPTION OF THE PREFERRED EMBODIMENTS

Figure 1A:
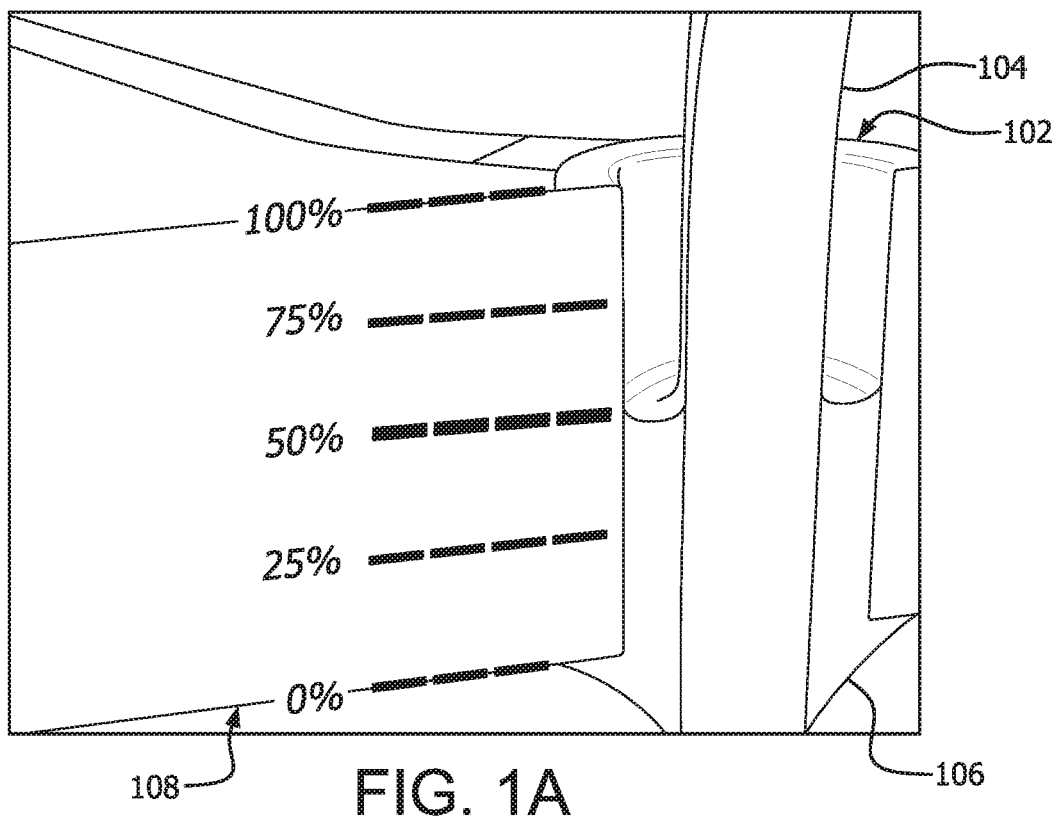
FIG. 1A is a three-dimensional cross-sectional view of a PCB illustrating solder fill.

Some implementations provide a printed circuit board configured to manage temperature dependent soldering failures. The printed circuit board includes a bonding surface disposed on a first surface of a printed circuit board, a first thermal relief pad on the first surface and partially surrounding the bonding surface, and a first conductive plane on the first surface and partially surrounding the first thermal relief pad. The first conductive plane is connected to the bonding surface by at least one first spoke. The printed circuit board also includes a second thermal relief pad on the first surface and partially surrounding the first thermal relief pad, and a second conductive plane on the first surface and partially surrounding the second thermal relief pad. The second conductive plane is connected to the first conductive plane by at least one second spoke which extends through the second thermal relief pad.

In some implementations, the printed circuit board includes a through-hole extending from the bonding surface through the printed circuit board. In some implementations, the printed circuit board includes a thermal insulation region surrounding the through-hole. In some implementations, the thermal insulation region comprises insulating material which excludes metal traces. In some implementations, the first thermal relief pad and the second thermal relief pad are circular; and wherein the first thermal relief pad and the second thermal relief pad are concentric. In some implementations, the at least one first spoke is non-collinear with the at least one second spoke. In some implementations, the printed circuit board includes at least one via extending from the second conductive plane into the printed circuit board to a metal layer such that the second conductive plane and the metal layer are electrically connected by a path through the at least one first spoke, the at least one second spoke, and the at least one via.

Some implementations provide a method for managing temperature dependent soldering failures. The method includes providing a bonding surface on a first surface of a printed circuit board, providing a first thermal relief pad on the first surface and partially surrounding the bonding surface, and providing a first conductive plane on the first surface and partially surrounding the first thermal relief pad. The first conductive plane is connected to the bonding surface by at least one first spoke. The method also includes providing a second thermal relief pad on the first surface and partially surrounding the first thermal relief pad, and providing a second conductive plane on the first surface and partially surrounding the second thermal relief pad. The second conductive plane is connected to the first conductive plane by at least one second spoke which extends through the second thermal relief pad.

In some implementations, the method includes providing a through-hole extending from the bonding surface through the printed circuit board. In some implementations, the method includes providing a thermal insulation region surrounding the through-hole. In some implementations, the thermal insulation region comprises insulating material which excludes metal traces. In some implementations, the first thermal relief pad and the second thermal relief pad are circular; and wherein the first thermal relief pad and the second thermal relief pad are concentric. In some implementations, the at least one first spoke is non-collinear with the at least one second spoke. In some implementations, the method includes providing at least one via extending from the second conductive plane into the printed circuit board to a metal layer such that the second conductive plane and the metal layer are electrically connected by a path through the at least one first spoke, the at least one second spoke, and the at least one via.

Some implementations provide a printed circuit board configured to manage temperature dependent soldering failures. The printed circuit board includes a bonding surface means on a first surface of a printed circuit board, a first thermal relief pad means on the first surface and partially surrounding the bonding surface means, and a first conductive plane means on the first surface and partially surrounding the first thermal relief pad means. The first conductive plane means is connected to the bonding surface means by at least one first spoke means. The printed circuit board also includes a second thermal relief pad means on the first surface and partially surrounding the first thermal relief pad, and a second conductive plane means on the first surface and partially surrounding the second thermal relief pad means. The second conductive plane means is connected to the first conductive plane means by at least one second spoke means which extends through the second thermal relief pad means.

In some implementations, the printed circuit board includes a through-hole means extending from the bonding surface means through the printed circuit board. In some implementations, the printed circuit board includes a thermal insulation region means surrounding the through-hole. In some implementations, the thermal insulation region means comprises insulating material which excludes metal traces. In some implementations, the first thermal relief pad means and the second thermal relief pad means are circular; and wherein the first thermal relief pad means and the second thermal relief pad means are concentric. In some implementations, the printed circuit board includes at least one via means extending from the second conductive plane means into the printed circuit board to a metal layer such that the second conductive plane means and the metal layer are electrically connected by a path through the at least one first spoke, the at least one second spoke, and the at least one via means.

Figure 1B:
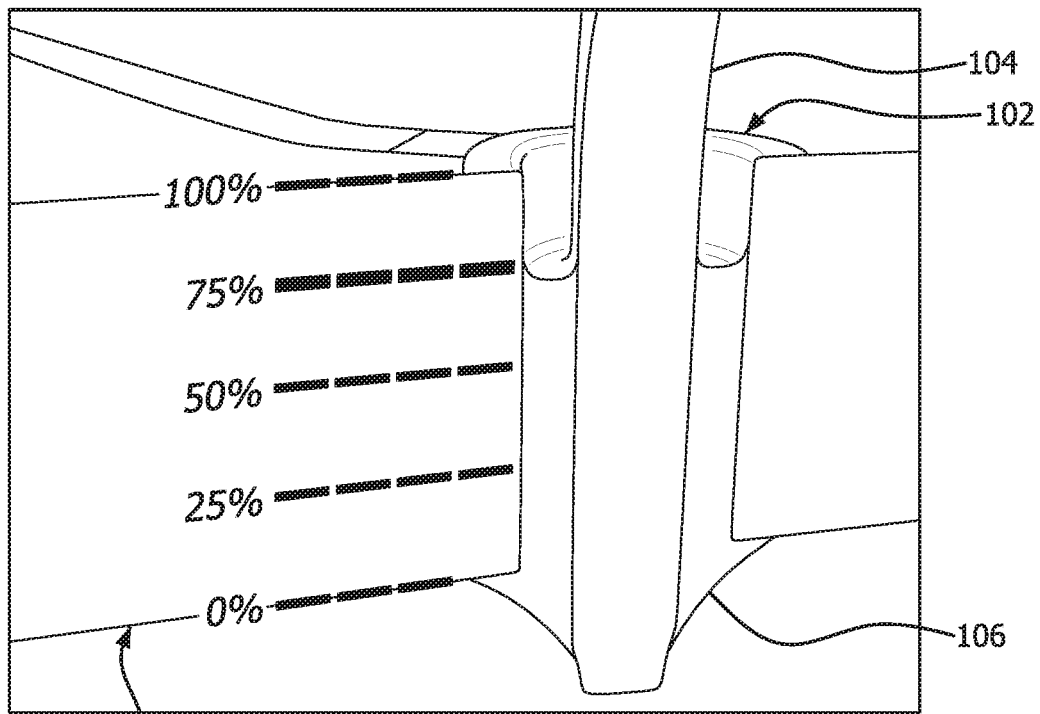
FIG. 1B is another three-dimensional cross-sectional view of the PCB shown in FIG. 1A.

FIGS. 1A and 1B are three-dimensional cross-sectional views of a PCB 100 which includes a through-hole 102 through which a component lead 104 is inserted. In FIG. 1A, solder 106 barrel fills through-hole 102 to a percentage barrel fill depth of 50% from the solder supply side 108 of PCB 100 (or correspondingly, to a percentage depression depth of approximately 50% from the opposite side 110 from the solder supply side 108). In FIG. 1B, solder 106 barrel fills through-hole 102 to a percentage barrel fill depth of approximately 75% from the solder supply side 108 of PCB 100 (or correspondingly, to a percentage depression depth of 25% from the opposite side 110 from the solder supply side 108).

In the example of FIG. 1A, the barrel fill depth is limited to approximately 50% by the heating temperature, heating time, and the heat dissipation characteristics of PCB 100. For example, for a particular temperature to which the PCB 100, through-hole 102, component lead 104, and solder 106 are heated, and/or for a particular time during which the particular temperature is maintained, solder 106 may cool below its solidification temperature before it can flow far enough into through-hole 102 to achieve a percentage barrel fill depth of greater than approximately 50%.

In the example of FIG. 1B, the heating temperature, heating time, and/or heat dissipation characteristics of PCB 100 are adjusted such that solder 106 does not cool below its solidification temperature until it flows far enough into through-hole 102 to achieve a percentage barrel fill depth of approximately 75%. While any of these variables (or other suitable variables) may be adjusted to increase the percentage barrel fill depth, it may not be desirable to increase the heating temperature or heating time due to energy cost and/or process timing considerations in high-volume manufacturing. Accordingly, it may be preferable in some circumstances to adjust the heat dissipation characteristics of PCB 100. In some examples, the heat dissipation characteristics are adjusted, as further described herein, to retain a greater amount of heat in through-hole 102 for the same (or in some implementations, reduced) heating temperature and heating time. This can have the advantage of improving solder joint quality without increasing costs, or of reducing costs without decreasing solder joint quality in some implementations.

Figure 2A:
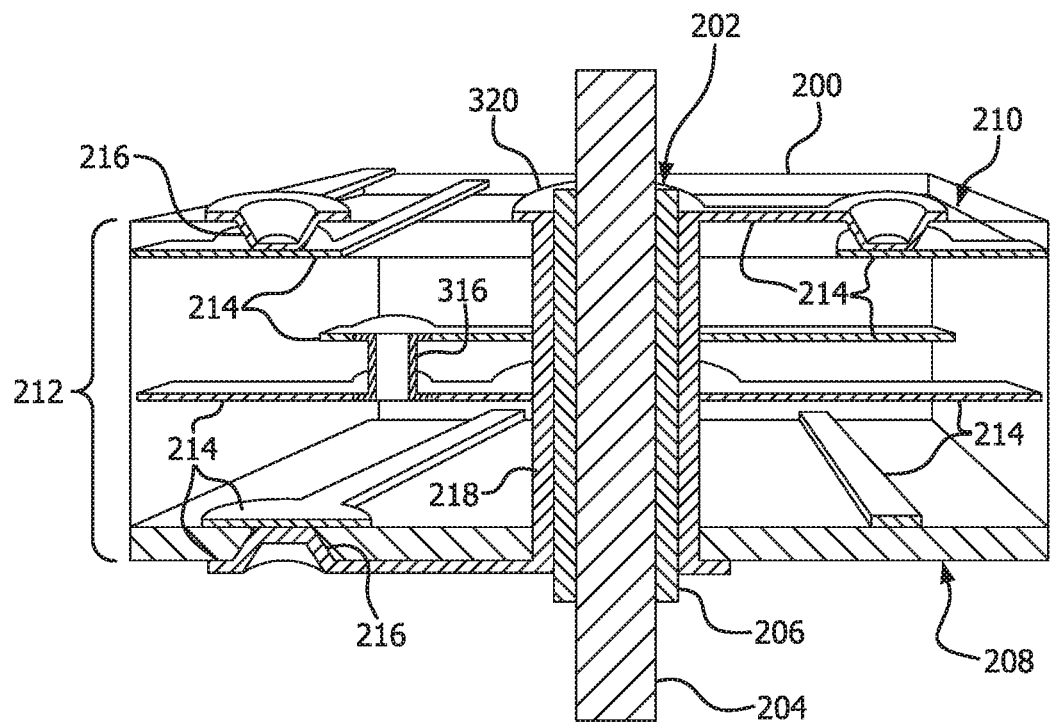
FIG. 2A is a three-dimensional cross-sectional view of a PCB illustrating structures of the PCB.

FIG. 2A is a three-dimensional cross-sectional view of a PCB 200. PCB 200 includes a through-hole 202 through which a component lead 204 is inserted. Solder 206 barrel fills through-hole 202 from the bottom side 208 (i.e., solder supply side) of PCB 200 to the top surface 210 (i.e., opposite the solder supply side). Through-hole 202 is shown as completely barrel filled (i.e. to a percentage barrel fill depth of 100%) with solder 206, simply for ease of illustration in this example.

PCB 200 includes a plurality of insulating layers 212, and conductive traces 214 disposed on and between insulating layers 212. Insulating layers 212 include any suitable electrically insulating material, such as a fiber-reinforced polymer resin, and/or polytetrafluroethylene (PTFE), composite epoxy material (CEM). Conductive traces 214 include any suitable electrically conducting material, such as copper, aluminum, or any other suitable metal or metal alloy. In some implementations, conductive traces 214 are created by patterning and etching voids in a conductive plane of material disposed on one of insulating layers 212 between conductive traces 214. Some or all of conductive traces 214 (e.g., those internal to PCB 200) may be created prior to assembly of PCB 200 as a stack of the insulating layers 212 and conductive traces 214. In some implementations, insulation material (e.g., a polymer resin or other suitable material) is filled into the voids prior to assembly of PCB 200 as a stack of the insulating layers 212 and conductive traces 214.

Vias 216 connect conductive traces 214 disposed on particular insulating layers 212 to other conductive traces 214 disposed on others of insulating layers 212. Vias 216 include any suitable electrically conducting material, such as copper, aluminum, or other metals or metal alloys. Some of conductive traces 214 connect to through-hole 202, e.g., through contact with solder 206, through contact with a conductive lining 218 of through-hole 202, or through contact with a bonding pad 220. Bonding pad 220 surrounds through-hole 202 on top surface 210 and includes any suitable electrically conducting material, such as copper, aluminum, or other metals or metal alloys.

Although solder 206 is shown with a 100% barrel fill depth in FIG. 2A, at certain heating temperatures and/or heating times, the barrel fill depth may not achieve 100%, e.g., due to heat dissipation characteristics of PCB 200. Such heat dissipation characteristics include structures tending to promote or allow heat dissipation away from through-hole 202. In the example of FIG. 2A, such features include conductive traces 214, conductive lining 218, and bonding pad 220. The thermal conductivity of conductive traces 214, conductive lining 218, and bonding pad 220 (e.g., of metal) is greater than the thermal conductivity of insulating layers 212 (e.g., of fiber-reinforced polymer resin). Accordingly, it may be desired to reduce the conduction of heat away from through-hole 202 by altering conductive traces 214, conductive lining 218, and/or bonding pad 220.

Figure 2B:
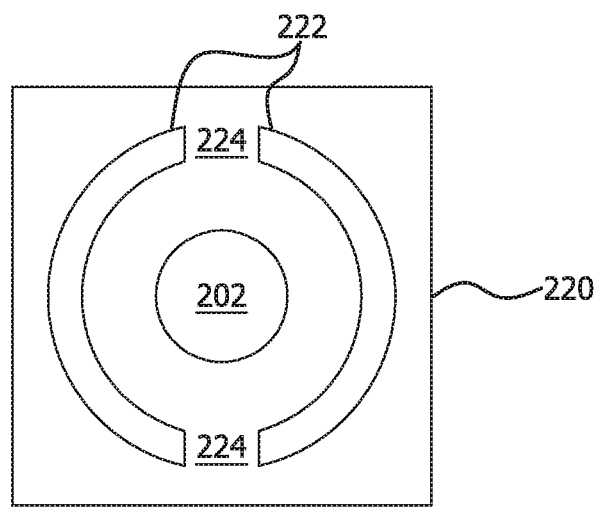
FIG. 2B is a plan view of thermal relief pads disposed on a top surface of the PCB illustrated in FIG. 2A.

FIG. 2B is a plan view of bonding pad 220 disposed on top surface 210 of PCB 200. Bonding pad 220 surrounds through-hole 202, and provides a conductive surface by which component leads, solder, and/or metal traces may be bonded to component lead 204. Bonding pad 220 promotes or allows heat dissipation away from through-hole 202 due to the thermal conductivity of its material (i.e., metal in this example) and because it is exposed to air at the top surface 210 of PCB 200 (i.e., uninsulated by polymer resin). Accordingly, thermal relief pads 222 are disposed within bonding pad 220, partially surrounding through-hole 202. Thermal relief pads 222 include voids in the conducting material of bonding pad 220 (e.g., by etching bonding pad 220). In some implementations, the voids are filled with a material (e.g., polymer resin, epoxy, and/or solder mask such as liquid photoimageable solder mask (LPSM) ink and/or dry-film photoimageable solder mask (DFSM)) that is both electrically and thermally insulating (or, correspondingly, less electrically and thermally conductive than the metal of bonding pad 220). In some implementations, the underlying substrate (i.e., the insulating layer on which bonding pad 220 is disposed) provides the thermal insulation.

In some implementations, a metal layer disposed on the top surface 210 is etched to form voids and the insulating material is deposited in the voids to form thermal relief pads 222. Thermal relief pads 222 are semi-circular in the example of FIG. 2A, however in some implementations, thermal relief pads may include angles (e.g., may include portions of a square), and/or include more complex curves, or other suitable geometry. Thermal relief pads 222 are separated by two conductive "spokes" 224 which connect the portion of bonding pad 220 immediately surrounding through-hole 202 with the portion of bonding pad 220 on the side of thermal relief pads 222 opposite through-hole 202. In other embodiments, a greater number of spokes separate a greater number of thermal relief pads (e.g., three spokes separate three thermal relief pads) or a single spoke is disposed through a single thermal relief pad. Any suitable number of spokes and thermal relief pads may be used.

Electricity flows between through-hole 202 and the portion of bonding pad 220 on the side of thermal relief pads 222 opposite through-hole 202 through spokes 224, and not through the thermal relief pads 222, due to the electrical insulation properties of thermal relief pads 222 and the conductive properties of spokes 224. Similarly, heat flows more readily between through-hole 202 and the portion of bonding pad 220 on the side of thermal relief pads 222 opposite through-hole 202 through spokes 224, and less readily through the thermal relief pads 222, due to the thermal insulation properties of thermal relief pads 222 and the thermal conduction properties of spokes 224. The material and dimensions (e.g., width, length, and/or depth) of spokes 224 are such that they exhibit suitable current- and heat-handling characteristics (e.g., resistance, electromigration, heating, melting, etc.) and also suitably inhibit dissipation of heat away from through-hole 202 (e.g., by providing a suitably narrow thermally conductive path). The material and dimensions (e.g., width, length, and/or depth) of thermal relief pads 222 are such that they exhibit a desired resistance to dissipation of heat from through-hole 202 (e.g., obstruct a suitable field of straight line paths outward from through-hole 202 and/or are of a width in the direction outward from through-hole 202 such that a desired amount of resistance to heat dissipation outward from through-hole 202 is achieved.)

The arrangement of spokes 224 and thermal relief pads 222 reduces or slows the dissipation of heat from through-hole 202 past the thermal relief pads 222. This can have the advantage of promoting or increasing retention of heat within through-hole 202 during soldering operations. In some implementations, this increases the solder barrel fill depth for a particular heating time and/or particular heating temperature over implementations which do not include thermal relief pads.

Figure 3A:
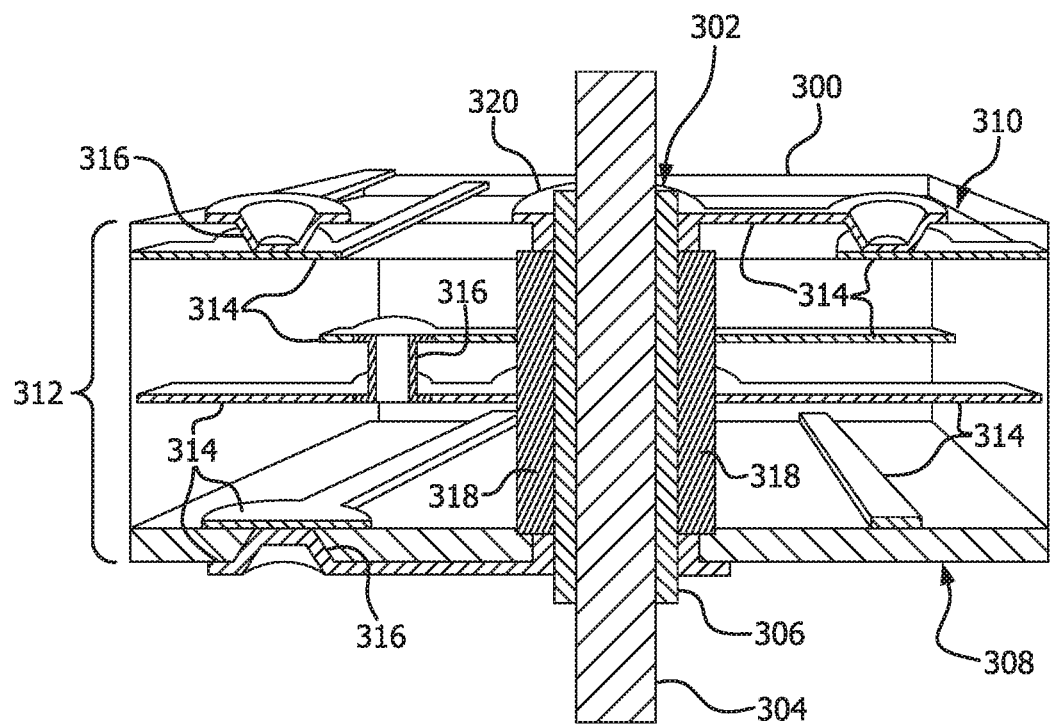
FIG. 3A is a three-dimensional cross-sectional view of a PCB illustrating structures of the PCB.

FIG. 3A is a three-dimensional cross-sectional view of a PCB 300. PCB 300 includes a through-hole 302 through which a component lead 304 is inserted. Solder 306 barrel fills through-hole 302 from the bottom side 308 (i.e., solder supply side) of PCB 300 to the top surface 310 (i.e., opposite the solder supply side). Through-hole 302 is shown as completely barrel filled (i.e. to a percentage barrel fill depth of 100%) with solder 306, simply for ease of illustration in this example.

PCB 300 includes a plurality of insulating layers 312, and conductive traces 314 disposed on and between insulating layers 312. Insulating layers 312 include any suitable electrically insulating material, such as a fiber-reinforced polymer resin. Conductive traces 314 include any suitable electrically conducting material, such as copper, aluminum, or any other suitable metal or metal alloy. In some implementations, conductive traces 314 are created by patterning and etching voids in a conductive plane of material disposed on one of insulating layers 312 between conductive traces 314. Some or all of traces 314 (e.g., those internal to PCB 300) may be created prior to assembly of PCB 300 as a stack of the insulating layers 312 and conductive traces 314. In some implementations, insulation material (e.g., a polymer resin or other suitable material) is filled into the voids prior to assembly of PCB 300 as a stack of the insulating layers 312 and conductive traces 314.

Vias 316 connect conductive traces 314 disposed on particular insulating layers 312 to other conductive traces 314 disposed on others of insulating layers 312. Vias 316 include any suitable electrically conducting material, such as copper, aluminum, or other metals or metal alloys. Bonding pad 320 surrounds through-hole 302 on top surface 310 and includes any suitable electrically conducting material, such as copper, aluminum, or other metals or metal alloys.

Although solder 306 is shown with a 100% barrel fill depth in FIG. 3A, at certain heating temperatures and/or heating times, the barrel fill depth may not achieve 100%, e.g., due to heat dissipation characteristics of PCB 300. Such heat dissipation characteristics include structures tending to promote or allow heat dissipation away from through-hole 302. In the example of FIG. 3A, such features include conductive traces 314, and bonding pad 320. The thermal conductivity of conductive traces 314, and bonding pad 320 (e.g., of metal) is greater than the thermal conductivity of insulating layers 312 (e.g., of fiber-reinforced polymer resin). Accordingly, it may be desired to reduce the conduction of heat away from through-hole 302 by conductive traces 314 and/or bonding pad 320.

Thermal insulator 318 is disposed within PCB 300 surrounding (or in some implementations, partially surrounding) through-hole 302. In some implementations, thermal insulator 318 is made up of regions of insulating material which separate through-hole 302 (or parts of through-hole 302) from conductive traces 314 and/or bonding pad 320. Thermal insulator 318 includes an insulation material with a thermal conductivity less than the thermal conductivity of conductive traces 314 and/or bonding pad 320 (e.g., of metal). In some implementations, thermal insulator 318 includes a polymer resin or other suitable material. In some implementations, thermal insulator 318 is made up of an area of insulating layers 312 devoid (or substantially devoid, or including relatively fewer in other implementations) of conductive traces 314. In some implementations, thermal insulator 318 includes a polymer resin or other suitable material deposited in voids etched in conductive planes of material disposed on insulating layers 312 between conductive traces 314 prior to assembly of PCB 300 as a stack of the insulating layers 312 and conductive traces 314.

The arrangement of thermal insulator 318 (e.g., between through-hole 302 and various thermally conductive structures such as conductive traces 314 and bonding pad 320, reduces, inhibits, slows, or otherwise controls the dissipation of heat from through-hole 202 through these structures. This can have the advantage of promoting or increasing retention of heat within through-hole 302 during soldering operations. In some implementations, this increases the solder barrel fill depth for a particular heating time and/or particular heating temperature over implementations which do not include a thermal insulator surrounding the through-hole.

Figure 3B:
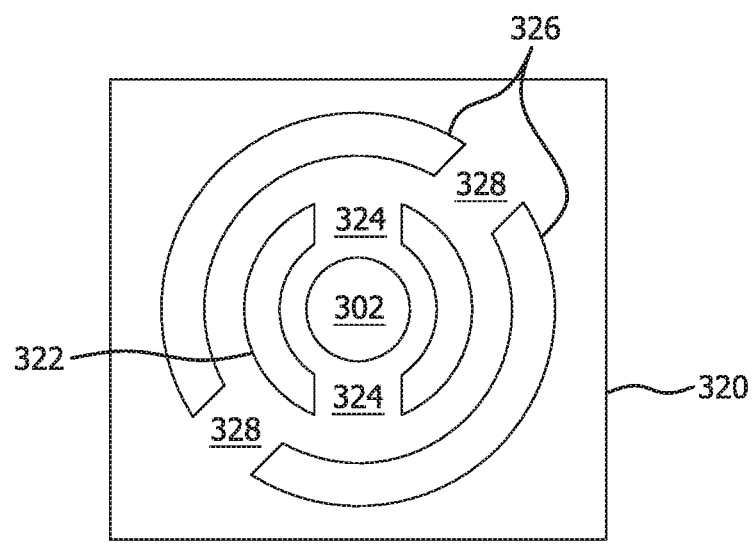
FIG. 3B is a plan view of thermal relief pads disposed on a top surface of the PCB illustrated in FIG. 3A.

FIG. 3B is a plan view of bonding pad 320 disposed on top surface 310 of PCB 300. Bonding pad 320 surrounds through-hole 302, and provides a conductive surface by which component leads, solder, and/or metal traces may be bonded to component lead 304. Bonding pad 320 promotes or allows heat dissipation away from through-hole 302 due to the thermal conductivity of its material (i.e., metal in this example) and because it is exposed to air at the top surface 310 of PCB 300 (i.e., uninsulated by polymer resin). Accordingly, thermal relief pads 322 are disposed within bonding pad 320, partially surrounding through-hole 302. Thermal relief pads 322 include voids in the material of bonding pad 320 (e.g., by etching bonding pad 320). In some implementations, the voids are filled with a material (e.g., polymer resin) that is both electrically and thermally insulating (or, correspondingly, less electrically and thermally conductive than the metal of bonding pad 320). In some implementations, the underlying substrate (i.e., the insulating layer on which bonding pad 320 is disposed) provides the thermal insulation.

In some implementations, a metal layer disposed on the top surface 310 is etched to form voids, and the insulating material is deposited in the voids to form thermal relief pads 322. Thermal relief pads 322 are semi-circular in the example of FIG. 3A, however in some implementations, thermal relief pads include angles (e.g., are portions of a square), and/or include more complex curves, or other suitable geometry. Thermal relief pads 322 are separated by two conductive spokes 324 which connect the portion of bonding pad 320 immediately surrounding through-hole 302 with the portion of bonding pad 320 on the side of thermal relief pads 322 opposite through-hole 302. In other embodiments, a greater number of spokes separate a greater number of thermal relief pads (e.g., three spokes separate three thermal relief pads) or a single spoke is disposed through a single thermal relief pad. Any suitable number of spokes and thermal relief pads may be used.

Thermal relief pads 326 are disposed within bonding pad 320, partially surrounding thermal relief pads 322 and through-hole 302. Thermal relief pads 326 are made up of a material (e.g., polymer resin) that is both electrically and thermally insulating (or, correspondingly, less electrically and thermally conductive than the metal of bonding pad 320). In some implementations, the material is filled into voids in the material of bonding pad 320 (e.g., created by etching bonding pad 320).

In some implementations, a metal layer disposed on the top surface 310 is etched to form voids and the insulating material is deposited in the voids to form thermal relief pads 326.

Thermal relief pads 326 are semi-circular in the example of FIG. 3A, however in some implementations, thermal relief pads include angles (e.g., are portions of a square), and/or include more complex curves, or other suitable geometry. Thermal relief pads 326 are separated by two conductive spokes 328 which connect the portion of bonding pad 320 on the side of thermal relief pads 322 opposite through-hole 302 with the portion of bonding pad 320 on the side of thermal relief pads 326 opposite thermal relief pads 322. In other embodiments, a greater number of spokes separate a greater number of thermal relief pads (e.g., three spokes separate three thermal relief pads) or a single spoke is disposed through a single thermal relief pad. Any suitable number of spokes and thermal relief pads may be used.

It is noted that the geometry of thermal relief pads 326 need not be the same as the geometry of thermal relief pads 322. For example, thermal relief pads 322 may be semi-circular and thermal relief pads 326 may be portions of a square in some implementations. It is also noted that while thermal relief pads 322 and 326 are concentric around through-hole 302, in some implementations, thermal relief pads 322 and 326 are not concentric. For example, thermal relief pads 326 may be offset from thermal relief pads 326. In some implementations, both thermal relief pads 322 and 326 may be concentric but offset from through-hole 302. In some implementations, thermal relief pads 322 and thermal relief pads 326 are concentric but offset from through-hole 302. Any other suitable configuration of thermal relief pads 322 and 326 is contemplated.

In the example of FIG. 3B, it is noted that spokes 324 are neither parallel nor collinear with spokes 328. Accordingly, there is no straight-line path of conductive material from through-hole 302 to the portion of bonding pad 320 on the side of thermal relief pads 326 opposite thermal relief pads 322. In some implementations, this has the effect of further reducing dissipation of heat outward from through-hole 302 to the portion of bonding pad 320 on the side of thermal relief pads 326 opposite thermal relief pads 322. In other embodiments, spokes 324 and 328 may be collinear, or may be offset such that while not collinear, a straight-line path of conductive material exists from through-hole 302 to the portion of bonding pad 320 on the side of thermal relief pads 326 opposite thermal relief pads 322, such path being thinner or otherwise of a lesser dimension than spokes 324 and/or 328.

Electricity flows between through-hole 302 and the portion of bonding pad 320 on the side of thermal relief pads 322 opposite through-hole 302 through spokes 324, and not through the thermal relief pads 322, due to the electrical insulation properties of thermal relief pads 322 and the conductive properties of spokes 324. Heat flows more readily between through-hole 302 and the portion of bonding pad 320 on the side of thermal relief pads 322 opposite through-hole 302 through spokes 324, and less readily through the thermal relief pads 322, due to the thermal insulation properties of thermal relief pads 322 and the thermal conduction properties of spokes 324.

Similarly, electricity flows between through-hole 302 and the portion of bonding pad 320 on the side of thermal relief pads 326 opposite thermal relief pads 322 and through-hole 302 through spokes 328, and not through the thermal relief pads 326, due to the electrical insulation properties of thermal relief pads 326 and the conductive properties of spokes 328. Heat flows more readily between through-hole 302 and the portion of bonding pad 320 on the side of thermal relief pads 326 opposite through-hole 302 and thermal relief pads 322 through spokes 328, and less readily through the thermal relief pads 326, due to the thermal insulation properties of thermal relief pads 326 and the thermal conduction properties of spokes 328.

The material and dimensions (e.g., width, length, and/or depth) of spokes 324 and 328 are such that they exhibit suitable current- and heat-handling characteristics (e.g., resistance, electromigration, heating, melting, etc.) and also suitably inhibit dissipation of heat away from through-hole 302 (e.g., by providing a suitably narrow thermally conductive path). The material and dimensions (e.g., width, length, and/or depth) of thermal relief pads 322 and 326 are such that they exhibit a desired resistance to dissipation of heat from through-hole 302. (e.g., obstruct a suitable field of straight line paths outward from through-hole 302 and/or are of a width in the direction outward from through-hole 302 such that a desired amount of resistance to heat dissipation outward from through-hole 302 is achieved.)

The arrangement of spokes 324 and 328 and thermal relief pads 322 and 326 reduces, inhibits, slows, or otherwise controls the dissipation of heat from through-hole 302 past the thermal relief pads 322. This can have the advantage of promoting or increasing retention of heat within through-hole 302 during soldering operations. In some implementations, this increases the solder barrel fill depth for a particular heating time and/or particular heating temperature over implementations which do not include thermal relief pads.

It is noted that any suitable number of sets of bonding pads can be implemented in other embodiments. For example, if thermal relief pads 326 and spokes 328 are described as "outside" of thermal relief pads 322 and spokes 324 with respect to through-hole 302, a further set or sets of thermal relief pads may be disposed "outside" of thermal relief pads 326 and spokes 328 as desired, e.g., to create a suitable combination of current handling capability and resistance to heat dissipation from through-hole 302.

Figure 4:
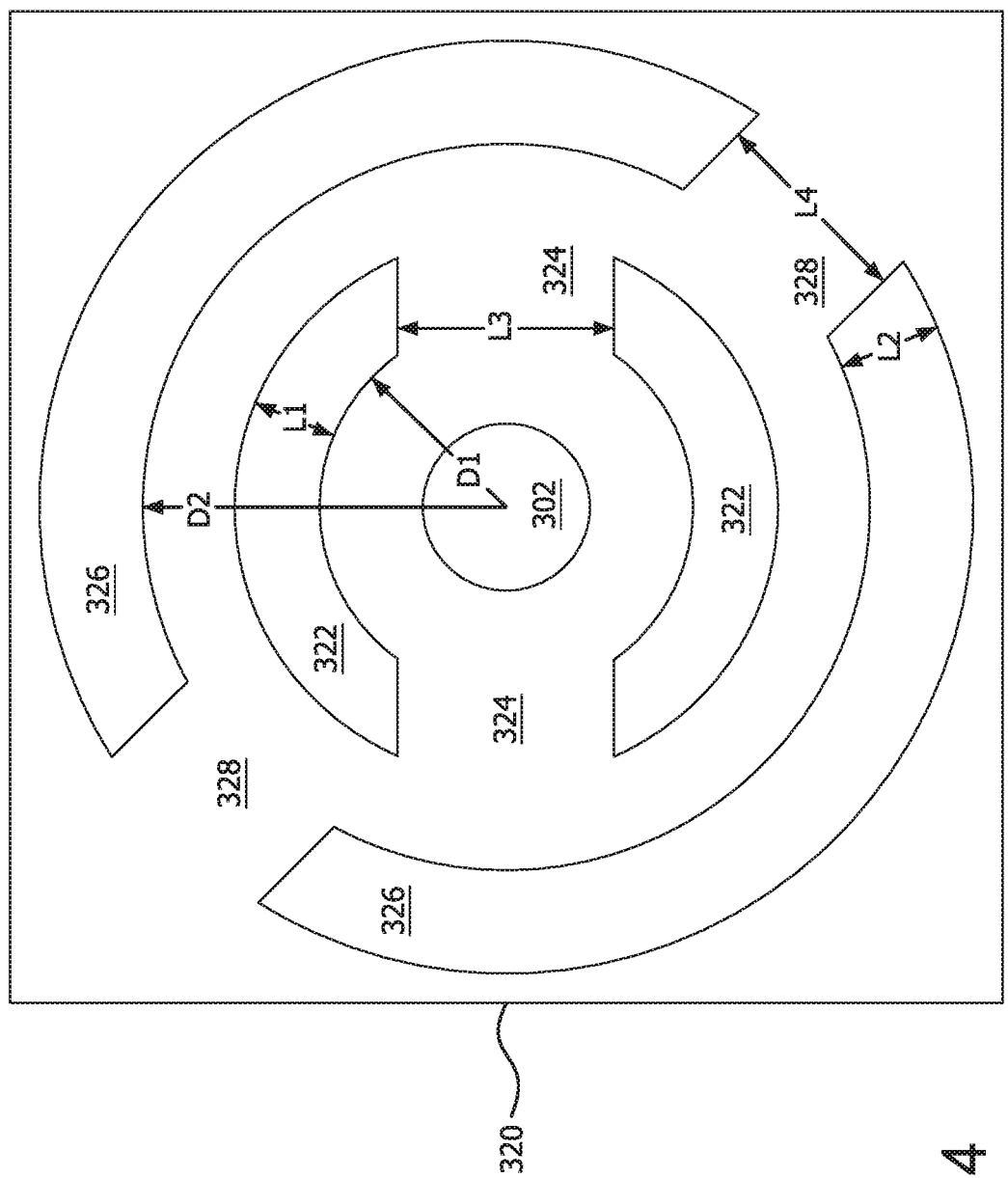
FIG. 4 is a plan view of the thermal relief pads illustrated in FIG. 3B, showing example dimensions.

FIG. 4 is a plan view of bonding pad 320, including thermal relief pads 322 and 326, and spokes 324 and 328 as shown and described with respect to FIG. 3B, showing example dimensions for adjusting heat dissipation, and current- and heat-handling capabilities.

FIG. 4 illustrates various dimensions of bonding pad 320, thermal relief pads 322 and 326, and spokes 324 and 328 which can be adjusted as parameters to specify and balance a desired amount of resistance to heat dissipation outward from through-hole 302 with suitable current- and heat-handling characteristics of the various conductive structures. For example, width L1 of thermal relief pads 322 and/or width L2 of thermal pads 326 can be specified in some implementations. Width L3 of spokes 324 and/or width L4 of spokes 328 can be specified in some implementations. Distance D1 of thermal relief pads 322 from the center of through-hole 302 and/or distance D2 of thermal pads 326 from the center of through-hole 302 can be specified in some implementations. In some implementation, the alignment and/or angular relationship between spokes 324 and 328 is adjustable. For example, as shown, spokes 324 and 328 are non-collinear, but also not perpendicular. Other possible relationships include a fully perpendicular non-collinear position, a fully collinear position, a partially collinear position, or any suitable alignment and/or angular relationship.

Although width L1 describes the same width for both thermal relief pads 322 in the example of FIG. 4, the width of each thermal pad can differ in other implementations. Similarly, widths L2 of thermal pads 326 can differ, widths L3 of spokes 324 can differ, widths L4 of spokes 328 can differ, distances D1 of thermal relief pads 322 can differ, and/or distances D2 of thermal pads 326 can differ in various implementations. Similarly, the number of spokes 324 can be varied, and the number of spokes 328 can be varied independently of the number of spokes 324. Spokes 324 and 328 are shown as symmetrically disposed about through-hole 302, however they need not be symmetrically disposed, and need not be disposed with the same symmetry or lack thereof.

Figure 5:
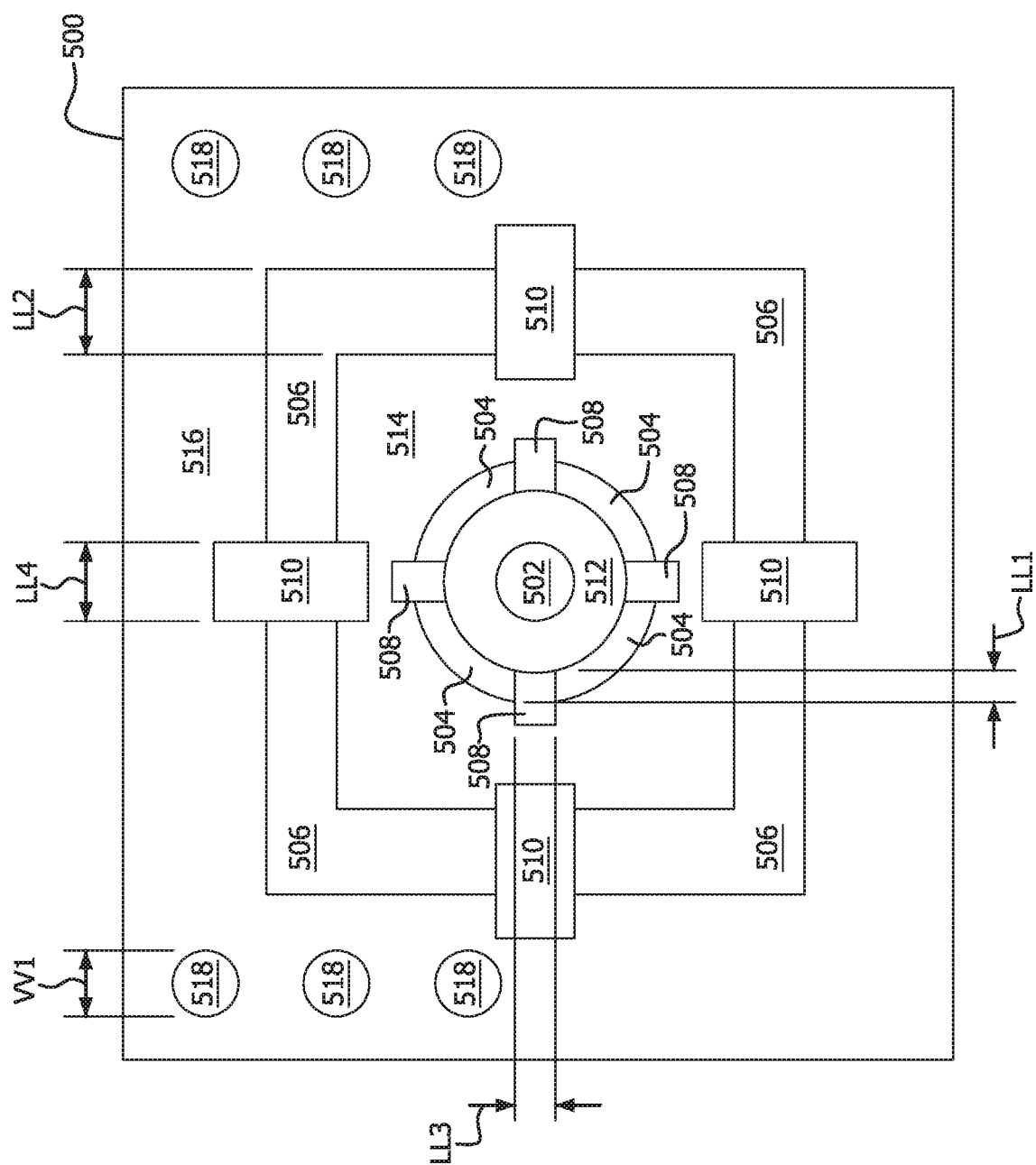
FIG. 5 is a plan view of another thermal relief pad configured to reduce, inhibit, slow, or otherwise control heat dissipation out of a through-hole.

FIG. 5 is a plan view of another example bonding pad 500, illustrating various example dimensions. Bonding pad 500 surrounds through-hole 502 and includes thermal relief pads 504 and 506 and spokes 508 and 510. In this example, each of thermal relief pads 504 has a curved geometry and an outline of all thermal relief pads 504 combine together as circular geometry, and each of pads 506 has an angled geometry and an outline of all thermal relief pads 506 combine together as rectangular geometry, although any suitable geometries are usable in other implementations. Thermal relief pads 504 partially separate a conductive bonding surface 512 surrounding through-hole 502 from a primary conductive plane 514. Thermal relief pads 506 partially separate primary conductive plane 514 from a secondary conductive plane 516.

Various dimensions of bonding pad 500, thermal relief pads 504 and 506, spokes 508 and 510, conductive bonding surface 512, and primary conductive plane 514, secondary conductive plane 516 can be adjusted as parameters to specify and balance a desired amount of resistance to heat dissipation outward from through-hole 502 with suitable current- and heat-handling characteristics of the various conductive structures. For example, width LL1 of thermal relief pads 504 and/or width LL2 of thermal relief pads 506 can be specified in some implementations. Width LL3 of spokes 508 and/or width LL4 of spokes 510 can be specified in some implementations. Similarly, distances of thermal relief pads 504 and/or 506 from the center of through-hole 502, distances and/or geometries of primary conductive plane 514 and/or secondary conductive plane 516, and/or any other suitable dimension of bonding pad 500 can each and/or all be adjusted in a suitable way to specify the desired electrical and thermal characteristics of bonding pad 500.

In some implementations, the alignment and/or angular relationship between spokes 508 and 510 is adjustable. For example, as shown, spokes 508 and 510 are non-collinear, but also not perpendicular. Other possible relationships include a fully perpendicular non-collinear position, a fully collinear position, a partially collinear position, or any suitable alignment and/or angular relationship, which may be adjusted as parameters to specify the desired electrical and thermal characteristics of bonding pad 500.

Bonding pad 500 also includes vias 518. Vias 518 connect secondary conductive plane 516 with one or more conductive layers beneath secondary conductive plane 516. In some implementations, e.g., where a thermal insulator (such as thermal insulator 318 shown and described with respect to FIG. 3A) excludes conductive layers from connecting with through-hole 502, vias 518 are used to electrically connect conductive bonding surface 512 to conductive layers (e.g., metal traces) beneath secondary conductive plane 516. In some implementations, this can have the advantage of providing an electrically conductive path while avoiding thermal dissipation through metal traces connected directly to through-hole 502. Vias 518 have a diameter VV1 in the example of bonding pad 500. The diameter and placement (e.g., within secondary conductive plane 516 and/or primary conductive plane 514) of vias 518 are adjustable as parameters to specify the desired electrical and thermal characteristics of bonding pad 500.

Figure 6B:
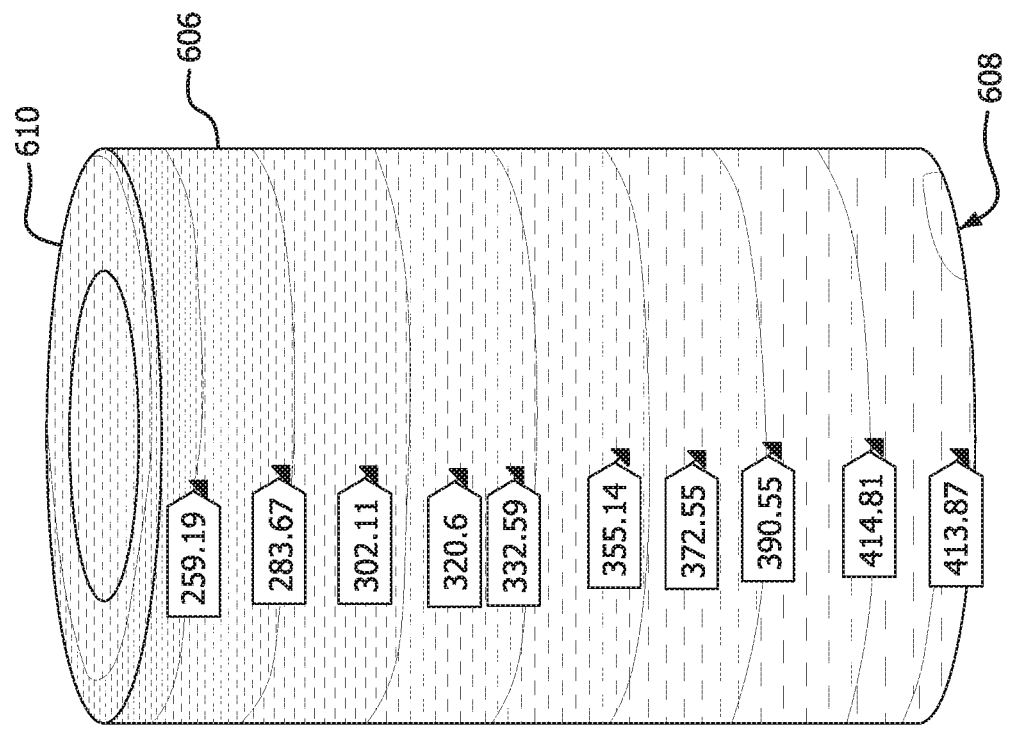
FIG. 6B is a three-dimensional temperature gradient view of solder in a through-hole which includes thermal relief structures.
Figure 6A:
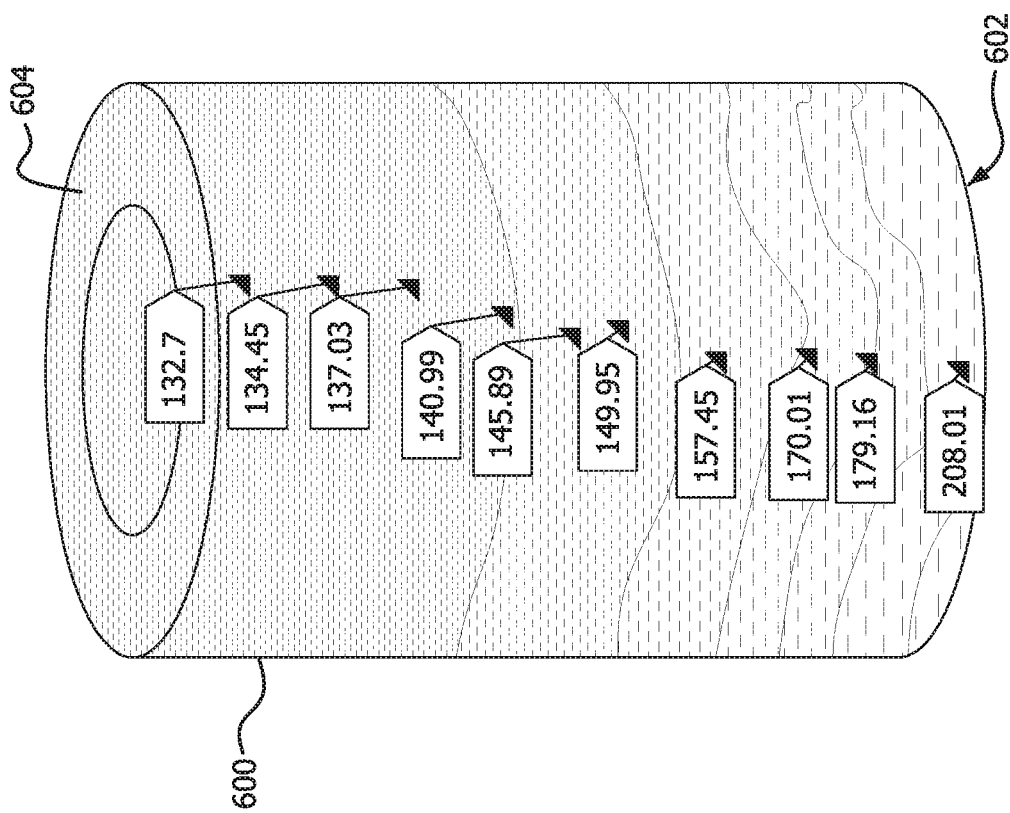
FIG. 6A is a three-dimensional temperature gradient view of solder in a through-hole which does not include thermal relief structures.

FIGS. 6A and 6B illustrate differences in retained heat and thermal gradient in solder within a through hole due to the application of various thermal relief techniques discussed herein.

FIG. 6A is a three-dimensional temperature gradient view of solder 600 in a through-hole from a solder supply side 602 to an opposite side 604 of a PCB which does not include thermal relief structures. Solder 600 is annotated with various temperatures illustrating its thermal gradient from solder supply side 602 to opposite side 604 after application of a particular heating temperature for a particular heating time. These temperatures are simply exemplary, and used for the sake of illustration.

FIG. 6B is a three-dimensional temperature gradient view of solder 606 in a through-hole from a solder supply side 608 to an opposite side 610 of a PCB which does not include thermal relief structures. Solder 606 is annotated with various temperatures illustrating its thermal gradient from supply side 608 to opposite side 610 after application of the same particular heating temperature for the same particular heating time as shown and described with respect to FIG. 6B. These temperatures are simply exemplary, and used for the sake of illustration.

The gradients of FIGS. 6A and 6B illustrate a greater retained temperature at the non-supply sides and throughout the through-holes for the same particular heating temperature and heating time. This greater retained temperature can have the advantage of improving barrel fill and/or solder joint quality in some cases.

Figure 7:
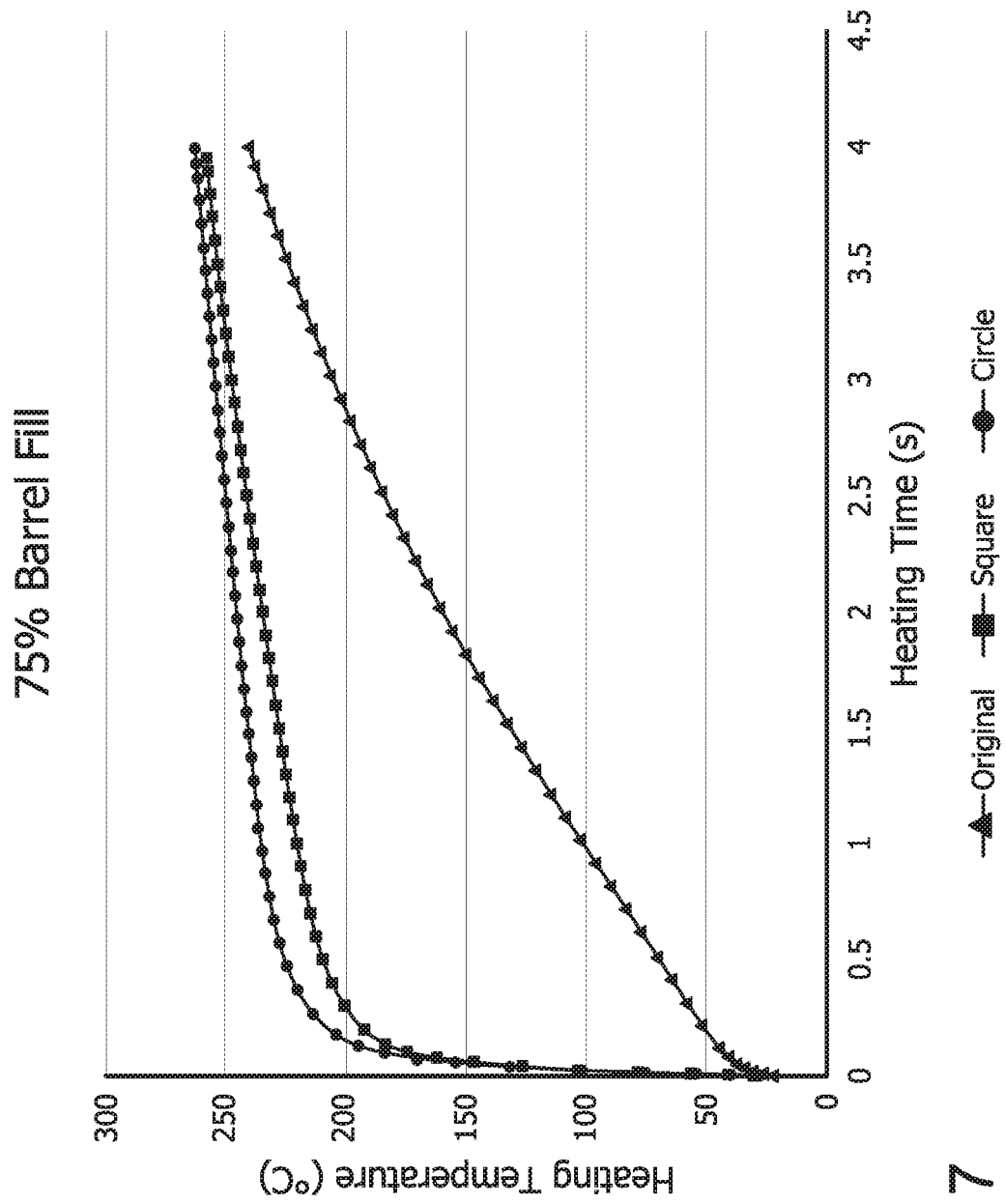
FIG. 7 is a line graph illustrating heating temperature versus heating time for a particular percentage solder fill of a through-hole for different thermal relief pad geometries.

FIG. 7 is a line graph illustrating heating temperature versus heating time for a particular percentage solder barrel fill (75% in this example) of a through-hole for different thermal relief pad geometries and thermal insulator configurations. Lines 700, 702, and 704 illustrate various differences in thermal characteristics provided by specific examples of different configurations of thermal relief structures shown and described herein. These lines are only examples; many other relationships of heating temperature versus heating time for a particular percentage solder barrel fill are possible with adjustments to the dimensions and configurations of the various thermal relief structures.

Line 700 illustrates the heating temperature versus heating time relationship for the example 75% solder barrel fill of through-hole 202 in example PCB 200 as shown and described with respect to FIG. 2A, using bonding pad 220 as shown and described with respect to FIG. 2B. Line 702 illustrates the heating temperature versus heating time relationship for the example 75% solder barrel fill of through-hole 302 in example PCB 300 as shown and described with respect to FIG. 3A (which includes thermal insulator 318), using bonding pad 320 as shown and described with respect to FIG. 3B and FIG. 4. Line 704 illustrates the heating temperature versus heating time relationship for the example 75% solder barrel fill of through-hole 302 in example PCB 300 as shown and described with respect to FIG. 3A (which includes thermal insulator 318), using bonding pad 500 as shown and described with respect to FIG. 5.

Figure 8:
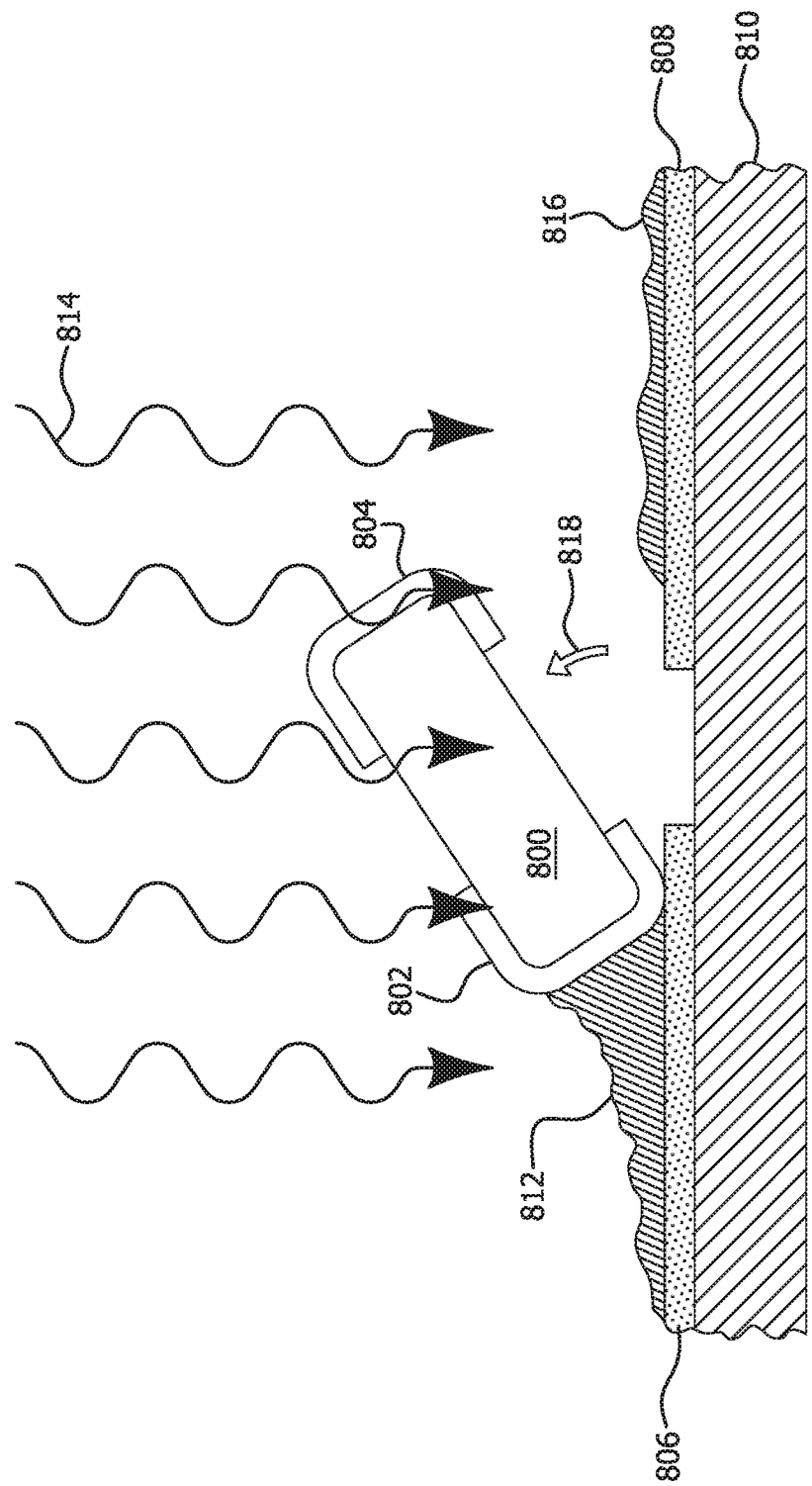
FIG. 8 is a cross-sectional side view of a surface mount component illustrating applicability of the thermal relief pads to surface mount technology.

FIG. 8 is a cross-sectional view of a surface mount component 800 illustrating applicability of the thermal relief pads to surface mount technology. The surface mount component 800 includes a contact 802 and a contact 804. Unlike a through-hole mounted component, the contacts 802 and 804 are mounted to the surfaces of bonding pads 806 and 808 respectively of PCB 810. Since the surface mounting of the surface mount component 800 does not involve a through-hole, solder barrel fill is not an issue. However, uneven heating and/or uneven heat dissipation from one or both of the bonding pads 806 and 808 can cause the surface mount component 800 to lift off of one of the bonding pads in a condition often referred to as "tombstoning". In this example, solder paste 812 disposed on bonding pad 806 reacts differently to reflow heating 814 than solder paste 816 disposed on bonding pad 808 due to uneven heat dissipation by the bonding pads 806 and 808, which causes the surface mount component 800 to tombstone by lifting off of the bonding pad 808 in the direction of arrow 818.

In some implementations, tombstoning and/or other undesirable effects of uneven heat dissipation in surface mount technologies can be mitigated by adding one or more thermal relief pads, such as shown and described herein, around one or both of the bonding pads 806 and 808, to reduce, inhibit, slow, and/or control heat dissipation from bonding pads 806 and 808.

It should be understood that many variations are possible based on the disclosure herein. Although features and elements are described above in particular combinations, each feature or element can be used alone without the other features and elements or in various combinations with or without other features and elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated.

What is claimed is:

1. A multi-layer printed circuit board, comprising:
   a first surface of the multilayer printed circuit board;
   an electrically conductive bonding surface disposed on the first surface;
   a first thermal relief pad disposed on the first surface and at least partially surrounding the electrically conductive bonding surface;
   a first conductive plane disposed on the first surface and at least partially surrounding the first thermal relief pad;
   at least one first spoke connecting the first conductive plane to the electrically conductive bonding surface, wherein the first spoke extends through the first thermal relief pad;
   a second thermal relief pad disposed on the first surface and at least partially surrounding the first conductive plane and the first thermal relief pad;
   a second conductive plane disposed on the first surface and at least partially surrounding the second thermal relief pad; and
   at least one second spoke connecting the second conductive plane to the first conductive plane, wherein the second spoke extends through the second thermal relief pad;
   wherein the second conductive plane includes at least one via extending from the second conductive plane into the printed circuit board to a metal layer, and
   wherein a through-hole extends from the electrically conductive bonding surface through the multi-layer printed circuit board and perpendicular to the electrically conductive bonding surface.

2. The multi-layer printed circuit board of claim 1, further comprising a thermal insulator disposed below the first surface and surrounding the through-hole.

3. The multi-layer printed circuit board of claim 2, wherein the thermal insulator comprises insulating material that isolates metal traces from the through-hole.

4. The multi-layer printed circuit board of claim 1, wherein the at least one first spoke is non-collinear with the at least one second spoke.

5. The multi-layer printed circuit board of claim 1, wherein the at least one first and second spokes are generally rectangular.

6. The multi-layer printed circuit board of claim 5, wherein the at least one second spoke has a greater surface area than the at least one first spoke.

7. The multi-layer printed circuit board of claim 6, wherein a number and width of the at least one first spoke is determined based on a current requirement of an electronic component connected to the electrically conductive bonding surface.

8. The multi-layer printed circuit board of claim 7, wherein a number and width of the at least one second spoke is determined based on the current requirement of the electronic component connected to the electrically conductive bonding surface.

9. The multi-layer printed circuit board of claim 1, wherein the electrically conductive bonding surface and the metal layer are electrically connected by a path through the at least one first spoke, the at least one second spoke, and the at least one via.

10. The multi-layer printed circuit board of claim 1, wherein areas of the first and second conductive planes are determined based on a current requirement of an electrical component connected to the electrically conductive bonding surface.

11. The multi-layer printed circuit board of claim 1, wherein the electrically conductive bonding surface and the first thermal relief pad are curved.

12. The multi-layer printed circuit board of claim 1, wherein the first surface is opposite a solder supply side of the multi-layer printed circuit board.

13. The multi-layer printed circuit board of claim 1, wherein the first surface is top surface of the multi-layer printed circuit board.

14. A printed circuit board configured to manage temperature dependent soldering failures, the printed circuit board comprising:
   a first surface of the multilayer printed circuit board;
   a bonding surface means disposed on the first surface;
   a first thermal relief pad means disposed on the first surface and partially surrounding the bonding surface means;
   a first conductive plane means disposed on the first surface and partially surrounding the first thermal relief pad means, the first conductive plane means connected to the bonding surface means by at least one first spoke means;
   a second thermal relief pad means disposed on the first surface and partially surrounding the first conductive plane means; and
   a second conductive plane means disposed on the first surface and partially surrounding the second thermal relief pad means, the second conductive plane means connected to the first conductive plane means by at least one second spoke means which extends through the second thermal relief pad means;
   wherein the second conductive plane means includes at least one via extending from the second conductive plane means into the printed circuit board to a metal layer, and
   wherein a through-hole extends from the bonding surface means through the printed circuit board, thermal insulator means surrounding the through-hole and isolating the through hole from conductive planes within the printed circuit board.

15. The printed circuit board of claim 14, wherein the at least one via extend from the second conductive plane means into the printed circuit board to the metal layer therein such that the bonding surface means and the metal layer are electrically connected.

16. In a multi-layer printed circuit board (PCB) comprising a first surface of the multilayer printed circuit board and an opposing second surface of the multilayer printed circuit board, and a thermal relief pad for managing heat generated by a soldering process, the thermal relief pad comprising:
   an electrically conductive bonding pad formed on the first surface, wherein a through-hole is located within the electrically conductive bonding pad and extends from the first surface to the opposing second surface;

a first thermal plane disposed on the first surface and at least partially surrounding the electrically conductive bonding pad;

a first conductive plane disposed on the first surface and at least partially surrounding the first thermal plane;

at least one first spoke connecting the first conductive plane to the electrically conductive bonding pad, wherein the first spoke extends through the first thermal plane;

a second thermal plane disposed on the first surface and at least partially surrounding the first conductive plane;

a second conductive plane disposed on the first surface and at least partially surrounding the second thermal plane; and at least one second spoke connecting the second conductive plane to the first conductive plane, wherein the second spoke extends through the second thermal plane, wherein one or more vias are disposed within the second conductive plane and extend from the second conductive plane to a conductive plane disposed within the multi-layer PCB, wherein the multi-layer PCB further comprises a thermal insulator disposed below the first surface and surrounding the through-hole, wherein the thermal insulator isolates the through-hole from conductive planes disposed within the multi-layer PCB.

* * * * *